(12) United States Patent
Komatsu

(10) Patent No.: US 8,766,658 B2
(45) Date of Patent: Jul. 1, 2014

(54) PROBE

(75) Inventor: Shigekazu Komatsu, Yamanashi (JP)

(73) Assignee: Tokyo Electron Limited, Tokyo (JP)

(*) Notice: Subject to any disclaimer, the term of this patent is extended or adjusted under 35 U.S.C. 154(b) by 351 days.

(21) Appl. No.: 13/054,533

(22) PCT Filed: Apr. 1, 2009

(86) PCT No.: PCT/JP2009/056801
§ 371 (c)(1),
(2), (4) Date: Jan. 17, 2011

(87) PCT Pub. No.: WO2010/007816
PCT Pub. Date: Jan. 21, 2010

(65) Prior Publication Data
US 2011/0115514 A1    May 19, 2011

(30) Foreign Application Priority Data

Jul. 18, 2008  (JP) .................................. 2008-187899

(51) Int. Cl.
| | | |
|---|---|---|
| G01R 31/20 | (2006.01) | |
| H01L 21/00 | (2006.01) | |
| G01R 3/00 | (2006.01) | |
| G01R 1/067 | (2006.01) | |

(52) U.S. Cl.
CPC ............. *G01R 31/20* (2013.01); *H01L 21/00* (2013.01); *G01R 3/00* (2013.01); *G01R 1/067* (2013.01)
USPC ............. 324/754.14; 324/754.1; 324/758.01; 324/755.01; 324/754.03; 324/754.01; 438/14; 438/15; 438/16; 438/17; 438/18; 439/66; 439/69; 439/91

(58) Field of Classification Search
CPC .......... G01R 31/20; G01R 3/00; G01R 1/067; H01L 21/00
USPC ............... 324/754.1, 754.14, 758.01, 755.01, 324/754.03, 754.01; 438/14–18; 439/66, 439/69, 91
See application file for complete search history.

(56) References Cited

U.S. PATENT DOCUMENTS

| | | | | |
|---|---|---|---|---|
| 4,065,197 | A | * | 12/1977 | Kuist et al. ...................... 439/66 |
| 4,576,872 | A | * | 3/1986 | Ward .............................. 428/550 |

(Continued)

FOREIGN PATENT DOCUMENTS

| | | |
|---|---|---|
| JP | 06-027141 A | 2/1994 |
| JP | 10-115637 A | 5/1998 |

(Continued)

OTHER PUBLICATIONS

International Search Report for PCT/JP2009/056801 dated Apr. 28, 2009.

*Primary Examiner* — Patrick Assouad
*Assistant Examiner* — Lamarr Brown
(74) *Attorney, Agent, or Firm* — Pearne & Gordon LLP

(57) ABSTRACT

A probe includes a contact member brought into contact with an object to be tested. Contact particles having conductivity are uniformly distributed in the contact member. A part of the contact particles protrude from a surface of the contact member on the side of the object to be tested. A conductive member having elasticity is placed on a surface of the contact member on the opposite side to the object to be tested. The probe further includes an insulating sheet including a through hole and the contact member is so positioned as to penetrate the through hole. An upper part of the contact member is formed of a conductor which does not include the contact particles. An additional conductor is placed on a surface of the conductor on the side opposite to the object to be tested.

11 Claims, 6 Drawing Sheets

(56) References Cited

U.S. PATENT DOCUMENTS

| | | | |
|---|---|---|---|
| 5,367,764 A * | 11/1994 | DiStefano et al. | 29/830 |
| 5,835,359 A * | 11/1998 | DiFrancesco | 361/803 |
| 6,337,218 B1 * | 1/2002 | Uzoh et al. | 438/14 |
| 6,565,667 B2 * | 5/2003 | Haerle et al. | 134/7 |
| 7,159,292 B2 * | 1/2007 | Suzuki et al. | 29/402.01 |
| 7,267,551 B2 * | 9/2007 | Amemiya et al. | 439/66 |
| 7,311,531 B2 * | 12/2007 | Igarashi et al. | 439/91 |
| 7,544,522 B2 * | 6/2009 | Kanda et al. | 438/16 |
| 7,649,369 B2 * | 1/2010 | Okumura et al. | 324/754.03 |
| 2003/0218252 A1 * | 11/2003 | Suzuki et al. | 257/737 |
| 2004/0201392 A1 * | 10/2004 | Kim et al. | 324/758 |
| 2005/0102828 A1 | 5/2005 | Suzuki et al. | |
| 2006/0154497 A1 * | 7/2006 | Amemiya et al. | 439/66 |
| 2007/0170934 A1 * | 7/2007 | Ma | 324/754 |
| 2007/0284759 A1 * | 12/2007 | Suguro et al. | 257/783 |
| 2008/0036479 A1 * | 2/2008 | Okumura et al. | 324/754 |
| 2008/0211523 A1 * | 9/2008 | Amemiya et al. | 324/754 |
| 2008/0211528 A1 * | 9/2008 | Amemiya et al. | 324/762 |
| 2009/0307986 A1 * | 12/2009 | Huang | 51/298 |
| 2012/0107971 A1 * | 5/2012 | Birang et al. | 438/16 |
| 2012/0244649 A1 * | 9/2012 | Sano et al. | 438/17 |

FOREIGN PATENT DOCUMENTS

| | | |
|---|---|---|
| JP | 11-064388 A | 3/1999 |
| JP | H11-133116 A | 5/1999 |
| JP | 2000-199767 A | 7/2000 |
| JP | 2002-148281 A | 5/2002 |
| JP | 2004-056078 A | 2/2004 |
| JP | 2005-249693 A | 9/2005 |
| JP | 2006-194620 A | 7/2006 |
| KR | 10-2002-0057364 A | 7/2002 |

* cited by examiner

PROBE

CROSS-REFERENCE TO RELATED APPLICATION

This Application is a U.S. national phase application under 35 U.S.C. §371 of PCT Application No. PCT/JP2009/056801 filed on Apr. 1, 2009, which claims the benefit of Japanese Patent Application No. 2008-187899 filed on Jul. 18, 2008, the entire disclosures of which are incorporated herein by reference.

TECHNICAL FIELD

The present invention relates to a probe which tests electrical characteristics of an object to be tested.

BACKGROUND ART

When electrical characteristics of a device such as IC and LSI (hereinafter, referred to as "device") formed on a semiconductor wafer (hereinafter, referred to as "wafer") are tested, a probe card having a circuit board and a probe is used. By way of example, a test is carried out by bringing a probe provided on a lower surface of a circuit board into contact with an electrode of a device formed on a wafer.

The electrode is made of conductive metal such as aluminum, for example. Since aluminum is likely to be oxidized, an oxide film as an insulator is formed on a surface of the aluminum. For this reason, if only the probe is brought into contact with the electrode, the oxide film formed on the surface of the electrode cannot be penetrated and electrical connection between the probe and the electrode cannot be obtained. Therefore, at the time of a test of electrical characteristics, in order to obtain the electrical connection between the electrode of the wafer and the probe, after the probe is brought into contact with the electrode, there is performed a so-called "scrub" action in which the wafer is vibrated in a horizontal direction and the oxide film is removed by a tip of the probe.

In this case, by way of example, as illustrated in FIG. 10, a probe 100 includes a cantilever 102 supported by a circuit board 101 and a contactor 103 extended from a free end of the cantilever 102 to a wafer W (see Patent Document 1). Further, while overdrive is applied to press the contactor 103 on an electrode P of the wafer W, the wafer W is vibrated in a horizontal direction, so that an oxide film O on a surface of the electrode P is removed. Accordingly, a tip 104 of the contactor 103 is brought into contact with a conductive portion of the electrode P.

Patent Document 1: Japanese Patent Laid-open Publication No. 2006-119024

DISCLOSURE OF THE INVENTION

Problems to Be Solved by the Invention

However, in accordance with the above-described method, the oxide film O removed by the scrub action may adhere to the tip 104 of the contactor 103 and impede stable electrical connection between the probe 100 and the electrode P. For this reason, cleaning of the tip 104 of the probe 100 needs to be performed regularly. However, the tip 104 may be abraded by such cleaning. Further, the scrub action may cause a large needle mark on a surface of the electrode P, which may inflict damage on the electrode P.

Among contact methods between a probe and an electrode without a scrub action, a contact method of a vertical high load represented by, for example, a pogo pin can be considered. However, in recent years, as a multi-function and high speed device is developed, a wiring structure becomes miniaturized and thinner, so that a wiring layer becomes very thin. Therefore, if a test is performed with the vertical high load contact method using, e.g., a pogo pin, a probe may penetrate not only an oxide film, but also an electrode or a wiring layer. Further, stress of load applied to the probe may inflict damage on the wiring layer or an insulating layer. On the contrary, if the load applied to the probe is reduced to avoid such damage, electrical connection between the probe and the electrode may become unstable.

In view of the foregoing, the present invention is provided to stably test electrical characteristics of an object to be tested with low probe load.

Means for Solving the Problems

In order to solve the above-mentioned problems, in accordance with the present invention, there is provided a probe for testing electrical characteristics of an object to be tested by bringing a contact member into contact with the object. Here, a plurality of contact particles having conductivity may be distributed in the contact member and a part of the contact particles may protrude from a surface of the contact member on the side of the object to be tested. Further, a conductive member having elasticity may be placed on a surface of the contact member on the opposite side to the object to be tested.

In accordance with the present invention, since the contact particles protrude from the contact member toward the object to be tested, even if load applied to the probe is low, the contact particles can easily penetrate the oxide film and electrical connection between the object and the probe can be obtained. Accordingly, it is possible to stably test the electrical characteristics of the object with low probe load. Further, since a conductive member having elasticity is placed on a surface of the contact member on the opposite side to the object to be tested, the probe is provided with elasticity and, thus, even if there is a height difference between electrodes on a wafer W, the height difference can be absorbed by the elasticity. Accordingly, it is possible to more stably test the electrical characteristics of the object to be tested.

Effect of the Invention

In accordance with the present invention, it is possible to stably test electrical characteristics of an object to be tested with low probe load.

EXPLANATION OF CODES

Figure 1:
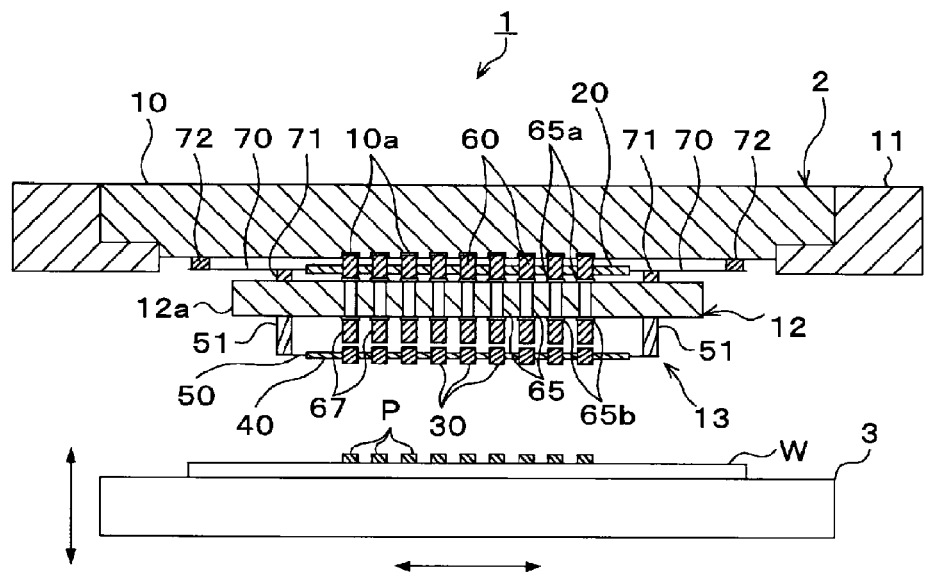
FIG. 1 is a side view showing a probe device having a probe in accordance with a present embodiment.

1: Probe device
2: Testing substrate
3: Mounting table
10: Circuit board
11: Holder
12: Intermediate
12a: Intermediate substrate
13: Probe
20: Elastic conductive sheet
30: Contact members
40: Insulating sheet
41: Front end
42: Conductive member
43: plating layer
45: Contact particle
45a: Contact particle
45b: Contact particle
46: Through hole
50: Metal frame
51: Adhesive
60: Conductive member
62: Insulating member
65: Electrical conduction path
65a: Upper terminal
65b: Lower terminal
67: Conductive member
70: Metal frame
70a: Frame-shaped member
70b: Plate-shaped member
71: Adhesive
72: Adhesive
86: Conductive adhesive
87: Probe
90: Coil spring

BEST MODE FOR CARRYING OUT THE INVENTION

Hereinafter, embodiments of the present invention will be explained. FIG. 1 is an explanatory diagram schematically showing a side view of a probe device 1 having a probe in accordance with a present embodiment. The probe device 1 includes, for example, a probe card 2 and a mounting table 3 which mounts thereon a wafer W as an object to be tested. The probe card 2 is placed above the mounting table 3. The probe card 2 includes, for example, a circuit board 10 which sends an electrical signal for testing to the wafer W mounted on the mounting table 3; a holder 11 which holds an outer periphery of the circuit board 10; an intermediate 12 which is placed on a lower side of the circuit board 10; and a probe 13 which is placed on a lower side of the intermediate 12 and is brought into contact with an electrode P on the wafer W to allow electrical connection between the circuit board 10 and the wafer W.

The circuit board 10 is electrically connected with a non-illustrated tester and receives and transmits electrical signals for testing from the tester to the probe 13 via the intermediate 12. The circuit board 10 is formed in, for example, a substantially circular plate shape. An electronic circuit is embedded in the circuit board 10 and a plurality of connecting terminals 10a of the electronic circuit is provided on a bottom surface of the circuit board 10.

The intermediate 12 includes, for example, a flat plate-shaped intermediate substrate 12a and an elastic conductive sheet 20 provided on a top surface of the intermediate substrate 12a. The intermediate substrate 12a is formed in, for example, a quadrangular shape and made of, for example, a silicon substrate or a glass substrate.

Figure 2:
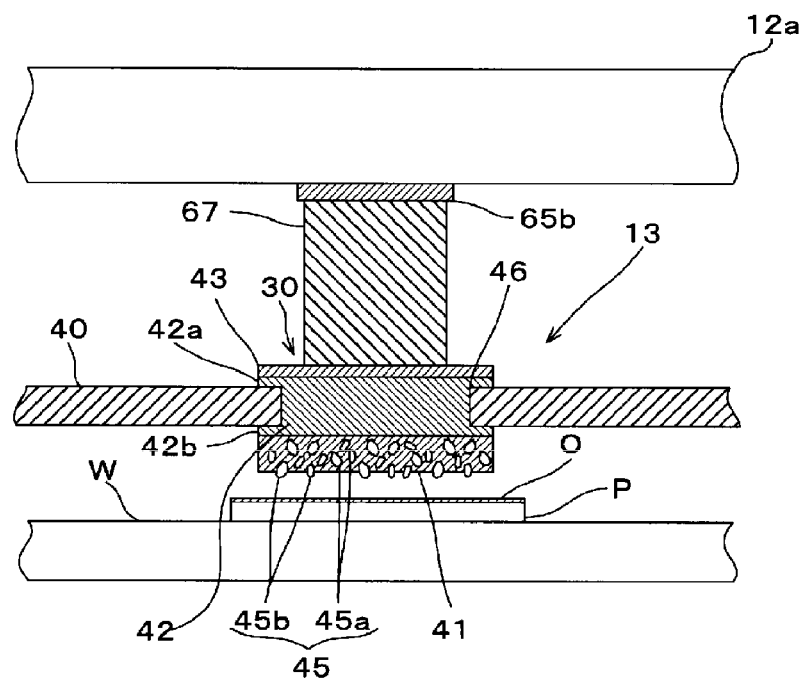
FIG. 2 is an explanatory diagram illustrating a schematic configuration of the probe in accordance with the present embodiment.

As illustrated in FIG. 2, the probe 13 provided on a bottom surface of the intermediate substrate 12a includes a contact member 30 brought into contact with the electrode P and an insulating sheet 40 made of a rubber sheet as an insulating material. The contact member 30 is provided at a position corresponding to a position of the electrode P on the wafer W. Further, the contact member 30 includes a front end 41; a conductor 42 which is formed on a top surface of the front end 41 and electrically connected with the front end 41; and a plating layer 43 as another conductor which is formed on a top surface of the conductor 42.

The front end 41 is formed of complex plating made by adding a plurality of conductive contact particles 45 into a high conductivity material (such as nickel plating) harder than the electrode P. As depicted in FIG. 2, contact particles 45a are distributed within the front end 41 and some contact particles 45b protrude from the front end 41's surface on the wafer side. That is, a part of the contact particle 45b is positioned within the front end 41 and the rest part of the contact particle 45b protrudes from the surface of the front end 41.

In the present embodiment, the contact particles 45 are fine particles formed by fragmenting a conductive material, such as SiC, TiC or conductive diamond, harder than a basic material of the front end 41 and the contact particles 45 have sharp fragmental surfaces. Further, since these fine contact particles 45 having sharp fragmental surfaces protrude from the front end 41 of the probe 13, even if low load is applied to the probe 13, the contact particles 45 easily penetrate an oxide film O formed on the surface of the electrode P. Furthermore, as a result of further researches, the present inventors have found that, for example, when load applied to the probe 13 is 1 gf/piece, an optimum diameter of the contact particle 45 is in the range of about 0.3 μm to about 2.0 μm so as to penetrate the oxide film O and obtain electrical connection with the electrode P.

The conductor 42 is provided to penetrate a through hole 46 of the insulating sheet 40 at a position corresponding to the position of the electrode P. The conductor 42 has locking members 42a and 42b in an upper periphery side and a lower periphery side. These locking members 42a and 42b can prevent the conductor 42 from being detached from the insulating sheet 40. The conductor 42 is made of, for example, copper in the present embodiment, but the conductor 42 may be made of any other conductors having good conductivity such as nickel.

The plating layer 43 is a protective film which prevents an oxide film from being formed on a surface of the conductor 42 by oxidation of the surface of the conductor 42. Used as a material of the plating layer 43 is, for example, gold. By using gold having good conductivity, it is possible to reduce contact resistance between the contact member 30 and a conductive member 67 to be described later.

Figure 3:
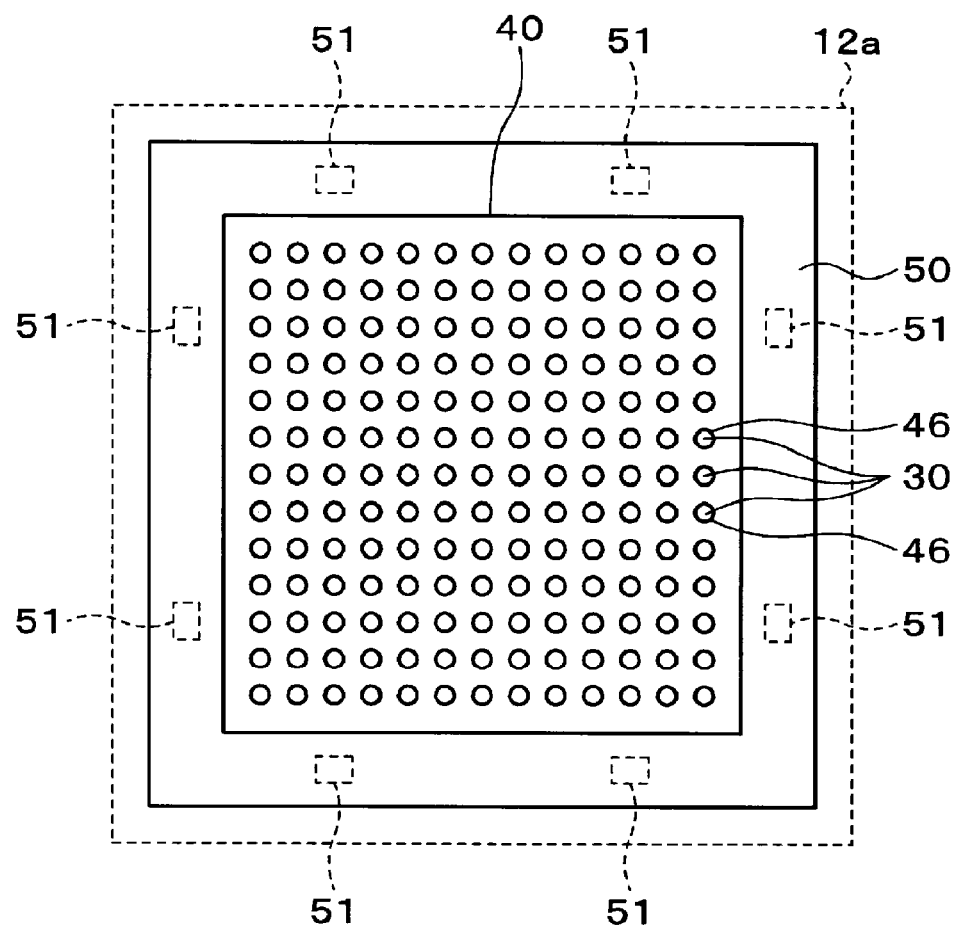
FIG. 3 is a plane view of an insulating sheet.

As illustrated in FIG. 3, the insulating sheet 40 is formed in, for example, a quadrangular shape and its outer periphery is mounted on a quadrangular metal frame 50. The metal frame 50 is made of, for example, a Fe—Ni alloy having the same thermal expansion coefficient as the wafer W. Formed in the insulating sheet 40 are the through holes 46 of a round shape at positions corresponding to the electrodes P of the wafer W, and as described above, the contact member 30 is provided in the through hole 46. Although the contact member 30 is illustrated as having a round shape in FIG. 3, it may have, for example, a quadrangular shape and it is not limited to the shape illustrated in the drawing. As depicted in FIG. 1, the metal frame 50 adheres to a bottom surface of the outer periphery of the intermediate substrate 12*a* by, for example, an elastic silicon adhesive 51.

Figure 4:
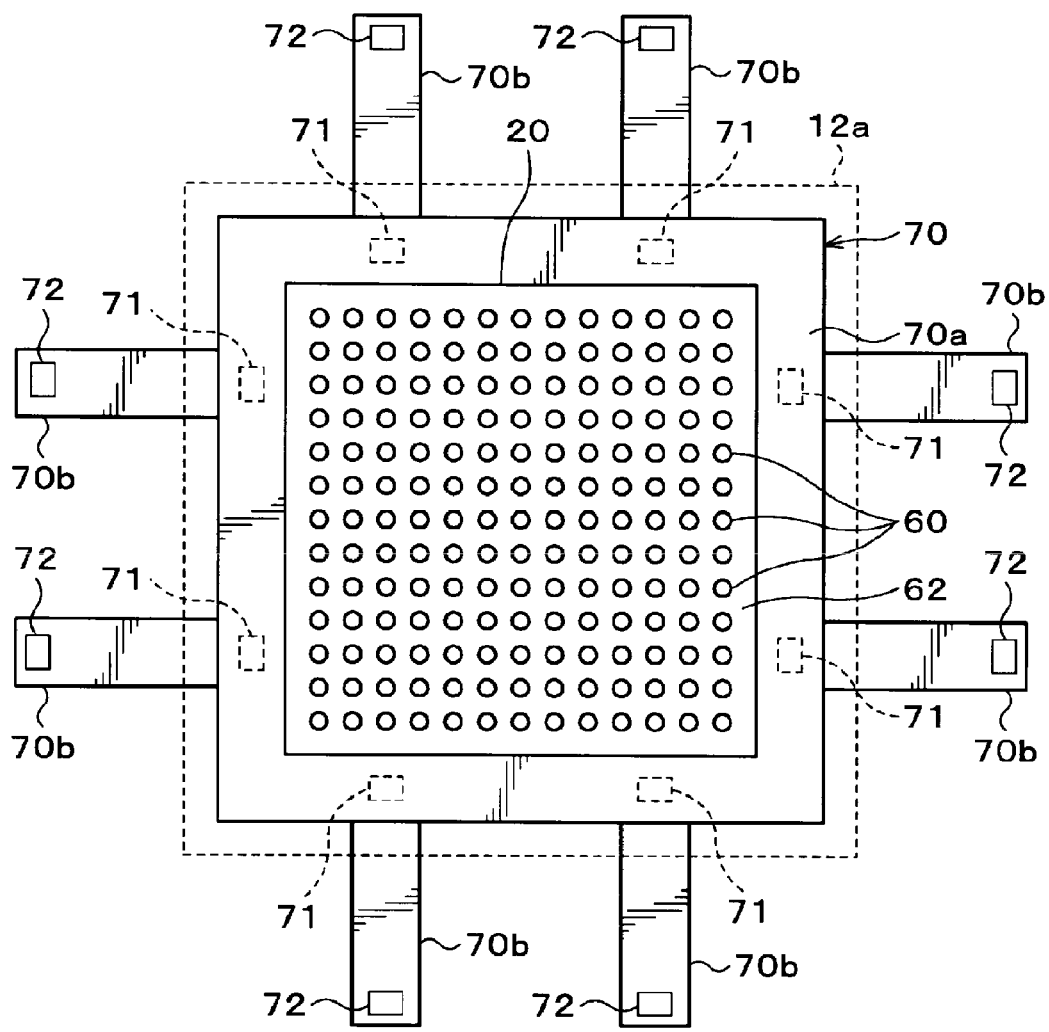
FIG. 4 is a plane view of an elastic conductive sheet.

The elastic conductive sheet 20 provided on the top surface of the intermediate substrate 12*a* is formed in, for example, a quadrangular shape as depicted in FIG. 4, and the whole sheet is formed of, for example, a rubber sheet as an elastic insulating material. The elastic conductive sheet is provided with a plurality of conductive members 60. The conductive members 60 are positioned at positions corresponding to, for example, the connecting terminals 10*a* of the circuit board 10 and upper terminals 65*a* of electrical conduction paths 65 (which will be described later) of the intermediate substrate 12*a*. The conductive members 60 are made of conductive particles densely packed into a part of the rubber sheet. By way of example, each conductive member 60 vertically penetrates the elastic conductive sheet 20 and protrudes from both upper and lower surfaces of the elastic conductive sheet 20. The elastic conductive sheet 20 other than the conductive members 60 is formed of an insulating member 62.

By way of example, as depicted in FIG. 4, the elastic conductive sheet 20 is fixed to a metal frame 70 surrounding an outer periphery of the elastic conductive sheet 20. In the same manner as the metal frame 50, the metal frame 70 is made of, for example, a Fe—Ni alloy having the same thermal expansion coefficient as the wafer W. The metal frame 70 includes a quadrangular frame-shaped member 70*a* formed along the outer periphery of the elastic conductive sheet 20 and a plurality of plate-shaped members 70*b* extended from the frame-shaped member 70*a* to the outside. As depicted in FIG. 1, the frame-shaped member 70*a* of the metal frame 70 adheres to the top surface of the outer periphery of the intermediate substrate 12*a* of the intermediate 12 by, for example, an elastic silicon adhesive 71. Accordingly, each conductive member 60 of the elastic conductive sheet 20 is brought into contact with each upper terminal 65*a* of the intermediate substrate 12*a*.

As depicted in FIG. 4, the plate-shaped member 70*b* of the metal frame 70 is formed in a rectangular shape elongated toward the outside and has flexibility. By way of example, the plate-shaped members 70*b* are arranged on an outer surface of the frame-shaped member 70*a* at equal distances from each other. The plate-shaped members 70*b* are extended to the outside of the intermediate 12 in a horizontal direction. As depicted in FIG. 1, an outer end of each plate-shaped member 70*b* adheres to the bottom surface of the circuit board 10 by, for example, an elastic silicon adhesive 72. Accordingly, each conductive member 60 of the elastic conductive sheet 20 is brought into contact with each connecting terminal 10*a* of the circuit board 10.

As depicted in FIG. 1, there are formed a plurality of the electrical conduction paths 65 passing through from a bottom surface to a top surface of the intermediate substrate 12*a* of the intermediate 12. The electrical conduction paths 65 are vertically formed in, for example, straight-line shapes in a thickness direction of the intermediate substrate 12*a*. Formed at upper ends of the electrical conduction paths 65 are upper terminals 65*a* and formed at lower ends of the electrical conduction paths 65 are lower terminals 65*b*. The conductive members 67 are formed on bottom surfaces of the lower terminals 65*b* of the intermediate substrate 12*a* and the conductive members 67 are electrically connected to the lower terminals 65*b*. By way of example, the conductive members 67 are positioned at positions corresponding to the electrodes P of the wafer W as an object to be tested, i.e., at positions corresponding to the contact members 30 of the probe 13. Further, the probe 13 and the circuit board 10 are electrically connected to each other by pressing the conductive member 67 on the contact member 30 of the probe 13. Furthermore, the inside of the conductive member 67 is densely packed with conductive particles (not shown). These conductive particles have lower hardness than the contact particles 45 in the front ends 41 of the contact members 30. Moreover, the conductive particles have lower electrical resistance than the contact particles 45. Used as conductive particles having such characteristics are nickel particles coated with gold or silver.

Hereinafter, there will be explained an operation of the probe device 1 configured as described above. When the wafer W is mounted on the mounting table 3, the mounting table 3 moves upward and the wafer W is pressed by the bottom surface of the probe 13. At this time, each electrode P of the wafer W is brought into contact with each contact member 30 of the probe 13 and pressed. Accordingly, the contact members 30 of the probe 13 are pressed in an upward direction by force acting upward from a lower side and brought into contact with the conductive members 67. Thus, the contact members 30 are electrically connected with the conductive members 67. Further, by further elevating the mounting table 3, load of about 1 gf/piece lower than conventional load is applied to the probe 13 in the upward direction.

Figure 5:
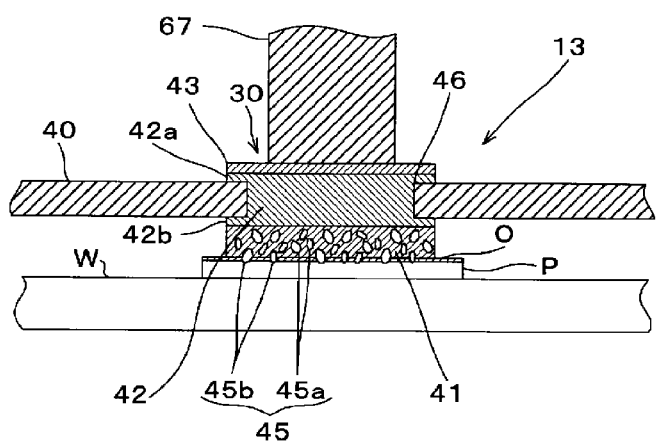
FIG. 5 is an explanatory diagram illustrating an electrical contact state between the probe and an electrode in accordance with the present embodiment.

When overdrive is applied to the probe 13 by further elevating the mounting table 3, the contact members 30 are pressed and moved by the conductive members 67 toward the electrodes P. Further, as depicted in FIG. 5, the contact particles 45*b* penetrate the oxide film O on the electrodes P and are brought into contact with the electrodes P, and, thus, electrical connection between the probe 13 and the electrodes P is obtained. At this time, since the probe 13 has the contact particles 45*b* protruding from the surface of the contact members 30, it is possible to easily penetrate the oxide film O and obtain the electrical connection between the electrodes P and the probe 13 with low load of about 1 gf/piece. For this reason, the probe 13 does not inflict damage on a wiring layer or an insulating layer due to stress of load applied to the probe 13. Furthermore, since the conductive members 67 and the elastic conductive sheet 20 which electrically connect the probe 13 with the circuit board 10 have elasticity, even if there is a height difference between the electrodes P, the height difference can be absorbed by the elasticity.

In accordance with the above-described embodiment, since the contact particles 45 of high hardness protrude from the contact members 30 toward the wafer W, even if low load is applied to the probe 13, it is possible to easily penetrate the oxide film O on the electrodes P and obtain the electrical connection between the electrodes P and the probe 13. For this reason, it is possible to stably test electrical characteristics of the wafer W with low load. Further, since the probe 13 can be brought into contact with the electrode P with low load, damage on the electrode P can be suppressed. Furthermore, since the probe 13 is vertically pressed, a scrub action is not needed. Accordingly, the oxide film O does not much adhere to the front end 41, and, thus, a frequency of cleaning of the probe 13 can be reduced.

Herein, by way of example, in order to reduce electrical resistance of the probe 13, it can be considered that the conductive member 67 is brought into direct contact with the electrode P of the wafer W at the time of a test without the contact member 30 of the present embodiment. However, in this case, since the conductive particles in the conductive member 67 have low hardness, these conductive particles cannot penetrate the oxide film O on the electrode P. The probe 13 of the present embodiment includes both the contact particles 45 of high hardness and the conductive particles of low electrical resistance, and, thus, total electrical resistance of the probe 13 is reduced by the conductive particles, and the contact particles 45 can penetrate the oxide film O on the electrode P and electrical connection between the electrode P and the probe 13 can be obtained. Therefore, a test of electrical characteristics of the wafer W can be appropriately carried out.

Figure 6:
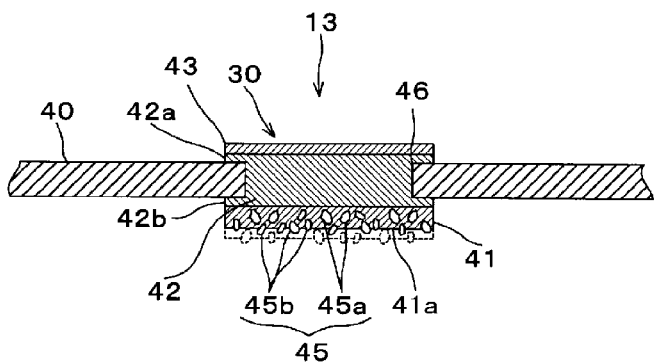
FIG. 6 is a side view showing a polished state of the probe in accordance with the present embodiment.

In accordance with the above-described embodiment, the contact particles 45 are uniformly distributed and solidified within the front end 41. Accordingly, even if the contact particles 45b protruding from the front end 41 are separated or lost by abrasion caused by repetitive use, a portion (i.e., a surface of the front end 41) indicated by a dashed line in FIG. 6 is immersed in, for example, an etching solution which etches only a basic material of the front end 41 so as to expose the contact particles 45a in the contact member 30 and a new front end 41a is formed. In this way, the probe 13 can be used repeatedly. For this reason, a lifetime of the contact member 30 can be extended, and, thus, a frequency of maintenance of the probe 13 can be reduced. Further, when the front end 41 is etched by immersing the contact member 30 in the etching solution, a protrusion size of the contact particle 45 is set to be longer than a thickness of the oxide film O on the electrode P, i.e., to be a length enough to penetrate the oxide film O. Alternatively, the contact particles 45 may be exposed by polishing the front end 41. In this case, since the contact member 30 is fixed to the insulating sheet 40, even if, for example, each contact member 30 is brought into contact with a polishing surface of a non-illustrated polishing apparatus during a polish process, it is not tilted nor moved. For this reason, the contact member 30 can be appropriately polished.

In accordance with the above-described embodiment, the conductive particles in the conductive member 67 have a lower hardness than the contact particles 45 and the conductive member 67 has elasticity. Further, the probe 13 and the intermediate 12 are electrically connected to each other via the elastic conductive member 67. For this reason, since the probe 13 has elasticity, even if there is a height difference between the electrodes P on the wafer W, the height difference can be absorbed by the elasticity.

In accordance with the above-described embodiment, since the plating layer 43 as a protective film for preventing oxidation is formed on the top surface of the conductor 42, contact resistance between the probe 13 and the conductive member 67 is reduced and, thus, electrical connection can be stably obtained.

In the above-described embodiment, it has been described that the contact member 30 includes the front end 41, the conductor 42, and the plating layer 43. However, the contact member 30 may include only the front end 41, i.e., the whole contact member 30 may be formed of complex plating and the contact particles 45 may be distributed in the whole contact member 30. Alternatively, the contact member 30 may include only the front end 41 and the plating layer 43.

Figure 7:
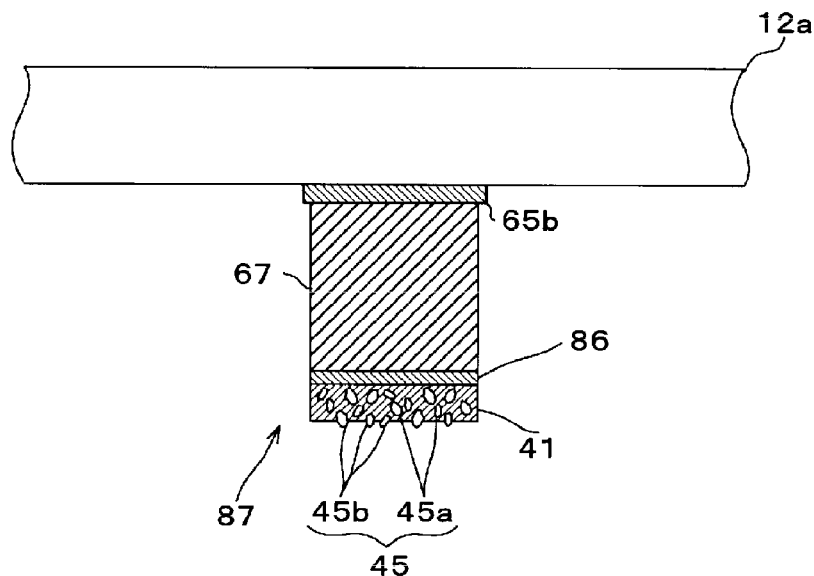
FIG. 7 is an explanatory diagram of a probe in accordance with another embodiment.

Further, instead of using the probe 13 described in the above embodiment, it may be possible to use a probe 87 in which the conductive member 67 is electrically connected with the front end 41 of the contact member 30 by using, for example, a conductive adhesive 86 as depicted in FIG. 7. In this case, the probe 87 can be easily fabricated. Further, as the conductive member 67, a vertical load probe such as PCR, a pogo pin, and a MEMS probe can be used and also a cantilever-type probe can be used.

Figure 8:
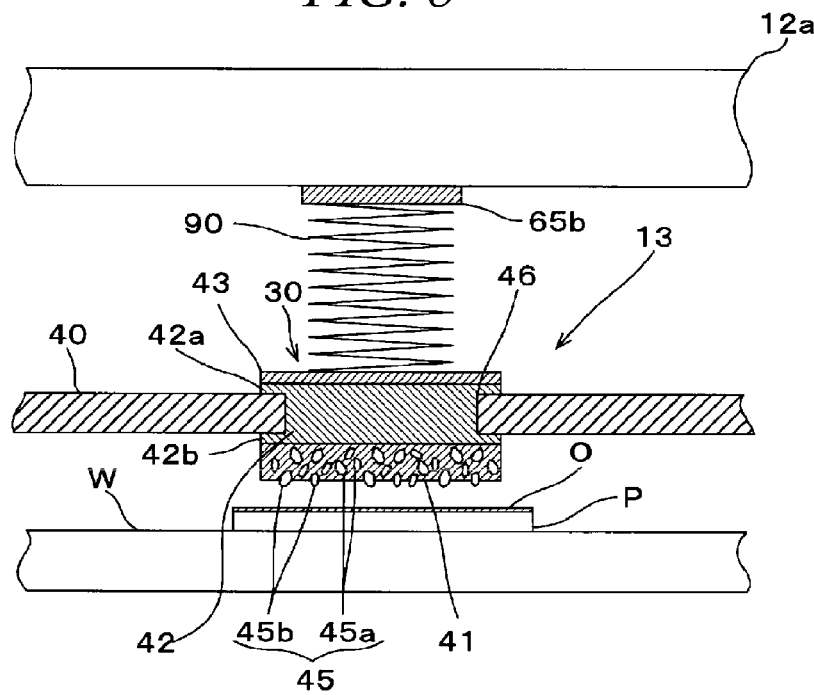
FIG. 8 is an explanatory diagram of a probe in accordance with still another embodiment.
Figure 9:
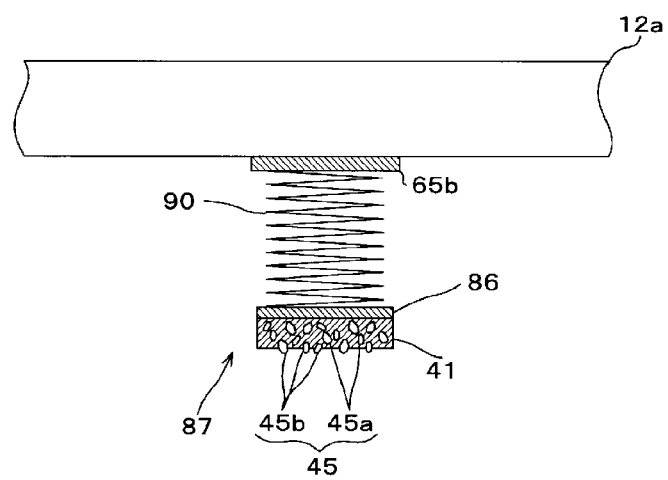
FIG. 9 is an explanatory diagram of a probe in accordance with still another embodiment.
Figure 10:
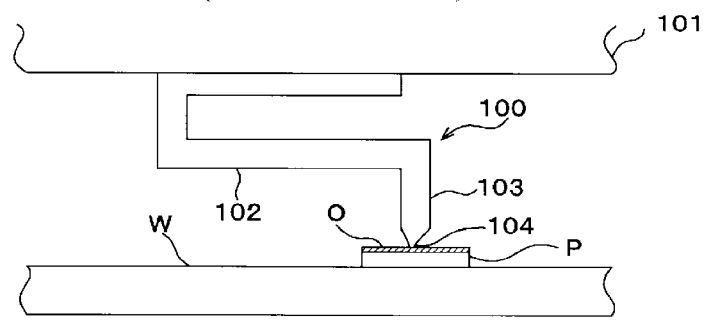
FIG. 10 is an explanatory diagram of a conventional probe.

In the probes 13 and 87 in accordance with the above-described embodiments, although a member including the conductive particles therein is used as the conductive member 67, it is not limited thereto as long as a member has elasticity and conductivity. By way of example, as depicted in FIG. 8, in the probe 13, a coil spring 90 may be provided as a conductive member. Likewise, by way of example, as depicted in FIG. 9, in the probe 87, the coil spring 90 may be provided as a conductive member. The other components of the probes 13 and 87 are the same as those of the probes 13 and 87 in the above-described embodiments, and, thus, explanation thereof will be omitted.

Here, by way of example, if a coil spring is used as a contactor to be brought into direct contact with an electrode of a wafer during a test, a front end of the coil spring cuts an oxide film on the electrode and the removed oxide film adheres to the front end of the coil spring. In this case, electrical resistance of the coil spring becomes increased and electrical characteristics of the wafer cannot be appropriately tested. However, in the probes 13 and 87 of the present embodiment, the front end 41 having the contact particles 45 of high hardness is provided at the front side of the coil spring 90, and, thus, even if low load is applied to the probes 13 and 87, the contact particles 45 easily penetrate the oxide film O on the electrode P and electrical connection between the electrode P and the probes 13 and 87 can be obtained. Further, since only vertical load is applied to the probes 13 and 87, the oxide film O is not removed and electrical resistance of the coil spring 90 is not increased. Accordingly, it is possible to stably test electrical characteristics of the wafer W with low load.

Further, in the probe 13, the front end of the coil spring 90 may cut a surface of the plating layer 43. However, since the plating layer 43 is made of gold, electrical resistance of the coil spring 90 is not increased due to the removed plating layer.

The embodiments of the present invention have been described with reference to the accompanying drawings, but the present invention is not limited thereto. It would be understood by those skilled in the art that various changes and modifications may be made in the scope of the following claims and it shall be understood that all modifications and embodiments are included in the present invention. Thus, the present invention is not limited to the above-described embodiments and may employ various aspects. The present invention may be applied to not only a case where a substrate is a semiconductor substrate, but also a case where a substrate is a FPD (flat panel display) substrate or a mask reticle for photomask.

INDUSTRIAL APPLICABILITY

The present invention is used for a probe for testing electrical characteristics of an object to be tested such as a semiconductor wafer.

What is claimed is:

1. A probe configured to test electrical characteristics of an object to be tested, the probe comprising:
    a contact member configured to be brought into contact with the object; and
    a conductive member configured to be electrically connected with the contact member,
    wherein a plurality of contact particles having conductivity are distributed in the contact member and a part of at least one of the contact particles protrudes from a first surface of the contact member configured to face the object, the conductive member having elasticity is placed on a second surface of the contact member which is opposite to the first surface, the conductive member includes a plurality of conductive particles having a lower electrical resistance than the plurality of contact particles, and each of the plurality of contact particles has a sharp fragmental surface facing the object for penetrating an oxide film on the object, and when the at least one of particles protruding from the first surface of the contact member are separated or lost by abrasion, contact particles within the contact member form a new front end so that sharp fragmental surfaces thereof are exposed.

2. The probe of claim 1, wherein the plurality of contact particles are uniformly distributed in the contact member.

3. The probe of claim 1, further comprising:
an insulating sheet including a through hole,
wherein the contact member is so positioned as to penetrate the through hole.

4. The probe of claim 3, wherein an upper part of the contact member is formed of a conductor which does not include the contact particles, and
the conductor is so positioned as to penetrate the through hole.

5. The probe of claim 4, wherein an additional conductor is placed on a surface of the conductor on the side opposite to the object to be tested.

6. The probe of claim 5, wherein the additional conductor is plating for preventing oxidation of the conductor.

7. The probe of claim 6, wherein the additional conductor is made of gold.

8. The probe of claim 1, wherein the contact member and the conductive member adhere to each other by a conductive adhesive.

9. The probe of claim 1, wherein
the conductive particles have lower hardness than the contact particles.

10. The probe of claim 1, wherein the conductive member is a coil spring.

11. The probe of claim 1, wherein the contact particles have higher hardness than the contact member.

* * * * *

UNITED STATES PATENT AND TRADEMARK OFFICE
CERTIFICATE OF CORRECTION

PATENT NO. : 8,766,658 B2  Page 1 of 1
APPLICATION NO. : 13/054533
DATED : July 1, 2014
INVENTOR(S) : Shigekazu Komatsu It is certified that error appears in the above-identified patent and that said Letters Patent is hereby corrected as shown below:

In the Specification

Column 5, line 14, please add - 20 - between "sheet" and "is"

Signed and Sealed this
Twenty-first Day of October, 2014

Michelle K. Lee
*Deputy Director of the United States Patent and Trademark Office*